United States Patent
Yamazaki et al.

(10) Patent No.: US 7,605,534 B2
(45) Date of Patent: Oct. 20, 2009

(54) LIGHT-EMITTING ELEMENT HAVING METAL OXIDE AND LIGHT-EMITTING DEVICE USING THE SAME

(75) Inventors: Shunpei Yamazaki, Tokyo (JP); Ryoji Nomura, Kanagawa (JP); Hiroko Abe, Tokyo (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 282 days.

(21) Appl. No.: 10/994,371

(22) Filed: Nov. 23, 2004

(65) Prior Publication Data

US 2005/0116633 A1 Jun. 2, 2005

(30) Foreign Application Priority Data

Dec. 2, 2003 (JP) ............................. 2003-403684
Dec. 2, 2003 (JP) ............................. 2003-403685

(51) Int. Cl.
*H01L 51/00* (2006.01)
*H05B 33/00* (2006.01)

(52) U.S. Cl. ..................................... 313/506; 313/504
(58) Field of Classification Search ................. 313/506, 313/504; 428/690, 917
See application file for complete search history.

(56) References Cited

U.S. PATENT DOCUMENTS

| 5,429,884 | A | | 7/1995 | Namiki et al. |
| 5,709,959 | A | * | 1/1998 | Adachi et al. ............... 428/690 |
| 5,917,279 | A | * | 6/1999 | Elschner et al. ............. 313/506 |
| 6,118,212 | A | | 9/2000 | Nakaya et al. |
| 6,316,874 | B1 | * | 11/2001 | Arai et al. .................... 313/504 |
| 6,392,250 | B1 | * | 5/2002 | Aziz et al. ...................... 257/40 |
| 6,392,339 | B1 | * | 5/2002 | Aziz et al. ................... 313/504 |
| 6,483,236 | B1 | * | 11/2002 | Hung .......................... 313/506 |

(Continued)

FOREIGN PATENT DOCUMENTS

EP 0 880 307 A2 11/1998

(Continued)

OTHER PUBLICATIONS

L.S. Hung et al., "Enhanced electron injection in organic electroluminescence devices using an Al/LiF electrode", Appl. Phys. Lett 70 (2) Jan. 13, 1997, pp. 152-154.

*Primary Examiner*—Karabi Guharay
(74) *Attorney, Agent, or Firm*—Nixon Peabody LLP; Jeffrey L. Costellia

(57) ABSTRACT

It is an object of the invention is to provide a light-emitting element in which failure of the light-emitting element due to separation can be controlled and stable luminescence can be obtained with high-efficiency and for a long stretch of time by controlling separation of layers constituting the light-emitting element. According to one aspect of a light-emitting element of the invention, the light-emitting element sandwiches a plurality of layers between a pair of electrodes, wherein at least one layer of the plurality of layers is a layer containing a substance selected from bismuth oxide, cobalt oxide, chromium oxide, copper oxide, nickel oxide, and titanium oxide, or at least one layer of layers different from a light-emitting layer among the plurality of layers is a mixed region of one substance selected from bismuth oxide, cobalt oxide, copper oxide, magnesium oxide, nickel oxide, zinc oxide, and titanium oxide and an organic compound.

11 Claims, 7 Drawing Sheets

U.S. PATENT DOCUMENTS

| | | | |
|---|---|---|---|
| 6,605,823 B1 * | 8/2003 | Pichler et al. | 257/40 |
| 6,774,561 B2 * | 8/2004 | Hirano | 313/503 |
| 7,040,943 B2 * | 5/2006 | Takahashi et al. | 445/6 |
| 7,151,341 B2 * | 12/2006 | Pichler et al. | 313/509 |
| 2002/0053871 A1 | 5/2002 | Seo | |
| 2003/0214227 A1 * | 11/2003 | Tsuchiya | 313/504 |
| 2005/0084712 A1 | 4/2005 | Kido et al. | |
| 2005/0098207 A1 | 5/2005 | Matsumoto et al. | |
| 2005/0118827 A1 * | 6/2005 | Sato et al. | 438/700 |
| 2005/0170208 A1 | 8/2005 | Yatsunami et al. | |
| 2005/0248267 A1 | 11/2005 | Gyoutoku et al. | |
| 2006/0008740 A1 | 1/2006 | Kido et al. | |
| 2006/0063460 A1 | 3/2006 | Seo | |
| 2007/0200125 A1 | 8/2007 | Ikeda et al. | |

FOREIGN PATENT DOCUMENTS

| | | |
|---|---|---|
| JP | 05-121172 | 5/1993 |
| JP | 09-063771 | 3/1997 |
| JP | 11-307259 | 11/1999 |
| JP | 2001093671 A * | 4/2001 |
| JP | 2005-026121 | 1/2005 |

* cited by examiner

LIGHT-EMITTING ELEMENT HAVING METAL OXIDE AND LIGHT-EMITTING DEVICE USING THE SAME

BACKGROUND OF THE INVENTION

1. Field of the Invention

The present invention relates to a light-emitting element having an anode, a cathode, and a layer containing an organic compound in which luminescence can be obtained by applying an electric field (hereinafter, referred to as a "layer containing a light-emitting substance"), and specifically to a light-emitting element which can achieve long term stabilization.

2. Description of the Related Art

A light-emitting element (also referred to as an organic or organic-inorganic hybrid electroluminescent element) and a solar battery are given as an example of a photoelectronic device using an organic semiconductor material as a functional organic material. These devices utilize electrical properties (carrier transportability) and optical properties (light absorption or light emission) of organic semiconductor materials, and specifically, the light-emitting element shows remarkable development.

A light-emitting element is formed by sandwiching a layer containing a light-emitting substance between a pair of electrodes (an anode and a cathode). As the light-emitting mechanism, it is said that a hole injected from an anode and an electron injected from a cathode are recombined at the luminescence center in the layer containing a light-emitting substance to form a molecular exciton when voltage is applied between the both electrodes and energy is discharged to emit luminescence when the molecular exciton returns to a ground state. A singlet excitation state and a triplet excitation state are known as an excited state, and it is considered that luminescence can be obtained by undergoing either excited state.

Conventionally, it has been attempted to increase luminous efficiency of a light-emitting element or to extend the life thereof. Although luminescence having high luminance can be obtained, there is a defect that an emission lifetime is short. As these factors, it can be considered that bondability between a metal electrode and a film during lamination, for example, an organic compound layer is not good due to electric conduction for a long time. Therefore, various considerations are made to increase luminous efficiency of a light-emitting element or to extend the life thereof.

Incidentally, a light-emitting element using an alkali metal having a low work function is know as a light-emitting element with good luminous efficiency so far (for example, Reference 1: Japanese Patent Laid-Open No. Hei 5-121172). Although the light-emitting element using an alkali metal has favorable efficiency, the alkali metal needs to be treated with religious care since it is easily oxidized; therefore, there is a problem that it is difficult to use the alkali metal for manufacturing a light-emitting element.

In addition, a light-emitting element which interpose a thin film insulating layer using metal fluoride or the like easy to be dealt with in an interface between an organic and a cathode is known, too (for example, see Reference 2: L. S. Hung, two others, Applied Physics Letters, vol. 70, pp. 152-154 (1997)). However, although luminous efficiency can be improved compared with a light-emitting element using an MgAg alloy known as a cathode with a low work function, there is a problem that the adhesiveness with an organic thin film is poor and stable luminescence cannot be easily obtained.

SUMMARY OF THE INVENTION

Accordingly, an object of the present invention is to provide a light-emitting element in which light is emitted efficiently and stable luminescence can be obtained for a long stretch of time. In addition, a light-emitting element to which a material that does not require a high technique during manufacturing the light-emitting element is applied and which is applicable to the mass production is provided.

As a result of repeating keen examination, the inventors found that light is emitted efficiently and stable luminescence can be obtained for a long stretch of time in a light-emitting element containing bismuth oxide, cobalt oxide, chromium oxide, copper oxide, nickel oxide, or titanium oxide. Therefore, a plurality of layers is sandwiched between a pair of electrodes in the invention, and a light-emitting element mainly utilizing an organic compound as a luminous body has a layer containing bismuth oxide, cobalt oxide, chromium oxide, copper oxide, nickel oxide, or titanium oxide.

Bismuth oxide, cobalt oxide, chromium oxide, copper oxide, nickel oxide, and titanium oxide have good adhesiveness with a metal film, a metallic oxide film, or the like that functions as an electrode of the light-emitting element. Furthermore, they have good adhesiveness with an organic compound.

Thus, the structure of the light-emitting element at least has one of layers containing a substance selected from bismuth oxide, cobalt oxide, chromium oxide, copper oxide, nickel oxide, and titanium oxide between an electrode and an organic compound of the light-emitting element or between a plurality of layers that is sandwiched between the electrodes of the light-emitting element. Accordingly, the light-emitting element with less failure due to separation between layers can be obtained.

According to one aspect of a specific structure in a light-emitting element of the invention, the light-emitting element sandwiches a plurality of layers between a pair of electrodes, wherein at least one of the plurality of layers is a layer containing a substance selected from bismuth oxide, cobalt oxide, chromium oxide, copper oxide, nickel oxide, and titanium oxide.

According to another aspect of a specific structure in a light-emitting element of the invention, the light-emitting element sandwiches a plurality of layers between a pair of electrodes, wherein a layer containing a substance selected from bismuth oxide, cobalt oxide, chromium oxide, copper oxide, nickel oxide, and titanium oxide is provided so as to be in contact at least with one of the electrodes.

In addition, as a result of repeating keen examination, the inventors also found that light is emitted efficiently and stable luminescence can be obtained for a long stretch of time in a light-emitting element utilizing an organic compound as a luminous body and in a light-emitting element having a region at least containing an organic compound and any one of compounds selected from bismuth oxide, cobalt oxide, copper oxide, magnesium oxide, nickel oxide, zinc oxide, and titanium oxide in a layer different from a light-emitting layer. Therefore, according to another aspect of the invention, a light-emitting element utilizing an organic compound as a luminous body has a region at least containing an organic compound and any one of compounds selected from bismuth oxide, cobalt oxide, copper oxide, magnesium oxide, nickel oxide, zinc oxide, and titanium oxide in a layer different from a light-emitting layer.

According to another aspect of a light-emitting element utilizing an organic compound as a luminous body, an organic compound having carrier (an electron, a hole) transportability or carrier injectability and any one of compounds selected from bismuth oxide, cobalt oxide, copper oxide, magnesium oxide, nickel oxide, zinc oxide, and titanium oxide are contained.

In addition, according to another aspect of a light-emitting element having a structure connecting a hole transport region comprising a hole transport material, a first mixed region containing both the hole transport material and a light-emitting material, a light-emitting region comprising the light-emitting material, a second mixed region containing both an electron transport material and the light-emitting material, and an electron transport region comprising the electron transport material, either the hole transport material or the electron transport material is an organic compound and any one of compounds selected from bismuth oxide, cobalt oxide, copper oxide, magnesium oxide, nickel oxide, zinc oxide, and titanium oxide.

In addition, according to another aspect of a light-emitting element having a structure connecting a hole transport region comprising a hole injection transport material, a first mixed region containing both the hole injection transport material and a first organic compound, a light-emitting region containing both the first organic compound and a second organic compound, a second mixed region containing both an electron transport material and the first organic compound, and an electron transport region comprising the electron transport material, and in which the second organic compound is a luminous body, either the hole transport material or the electron transport material is an organic compound and any one of compounds selected from bismuth oxide, cobalt oxide, copper oxide, magnesium oxide, nickel oxide, zinc oxide, and titanium oxide.

In addition, according to another aspect of the light-emitting element, the above-mentioned mixed regions contain 10 wt. % or more of any one of compounds selected from bismuth oxide, cobalt oxide, copper oxide, magnesium oxide, nickel oxide, zinc oxide, and titanium oxide.

According to another aspect of a light-emitting element having a structure connecting a hole injection region comprising a hole injection material, a first mixed region containing both the hole injection material and a hole transport material, a hole transport region comprising the hole transport material, a second mixed region containing both the hole transport material and a light-emitting material, a light-emitting region comprising the light-emitting material, a third mixed region containing both the light-emitting material and an electron transport material, an electron transport region comprising the electron transport material, a fourth mixed region containing both the electron transport material and a hole blocking material, a hole blocking region comprising the hole blocking material, a fifth mixed region containing both the hole blocking material and an electron injection material, and an electron injection region comprising the electron injection material, any one of the hole injection material, the hole transport material, the electron transport material, or the electron injection material is an organic compound and any one of compounds selected from bismuth oxide, cobalt oxide, copper oxide, magnesium oxide, nickel oxide, zinc oxide, and titanium oxide.

According to another aspect of a light-emitting element having a structure connecting a hole injection region comprising a hole injection material, a first mixed region containing both the hole injection material and a hole transport material, a hole transport region comprising the hole transport material, a second mixed region containing both the hole transport material and a first organic compound, a light-emitting region containing both the first organic compound and a second organic compound, a third mixed region containing both the first organic compound and an electron transport material, an electron transport region comprising the electron transport material, a fourth mixed region containing both the electron transport material and a hole blocking material, a hole blocking region comprising the hole blocking material, a fifth mixed region containing both the hole blocking material and an electron injection material, and an electron injection region comprising the electron injection material, and in which the second organic compound is a luminous body, any one of the hole injection material, the hole transport material, the electron transport material, or the electron injection material is an organic compound and any one of compounds selected from bismuth oxide, cobalt oxide, copper oxide, magnesium oxide, nickel oxide, zinc oxide, and titanium oxide.

In addition, according to another aspect of the light-emitting element, any one of the above-mentioned mixed regions contain 10 wt. % or more of any one of compounds selected from bismuth oxide, cobalt oxide, copper oxide, magnesium oxide, nickel oxide, zinc oxide, and titanium oxide.

Note that the light-emitting element of the invention obtained in such a manner can emit light efficiently and obtain stable luminescence for a long stretch of time. Accordingly, life extension of the light-emitting device using this as a light-emitting element (an image display device or a light-emitting device) can be achieved. Therefore, the invention includes a light-emitting device applying the light-emitting element of the invention.

Note that a light-emitting device in this specification refers to an image display device or a light-emitting device using an electroluminescent element as a light-emitting element. In addition, a module attaching a connector, for example, an anisotropic conductive film, a TAB (Tape Automated Bonding) tape, or a TCP (Tape Carrier Package) to an electroluminescent element; a module provided with a printed wiring board at the end of a TAB tape or a TCP; or a module on which an IC (integrated circuit) is directly mounted by a COG (Chip On Glass) method are all included in the light-emitting device.

According to the invention, it is possible to provide a light-emitting element in which light is emitted efficiently and stable luminescence can be obtained for a long stretch of time. In addition, a light-emitting element using a material that does not require a high technique during manufacturing the light-emitting element and applicable to the mass production can be provided.

These and other objects, features and advantages of the present invention will become more apparent upon reading of the following detailed description along with the accompanied drawings.

DETAILED DESCRIPTION OF THE INVENTION

Embodiment Mode of the present invention will be described in detail with reference to the accompanying drawings. However, it is to be understood that the invention is not limited to the description below and various changes and modifications will be apparent to those skilled in the art, unless such changes and modifications depart from the content and scope of the invention. Therefore, the invention is not interpreted by limiting to the description in this embodiment mode.

Embodiment Mode 1

Figure 1:
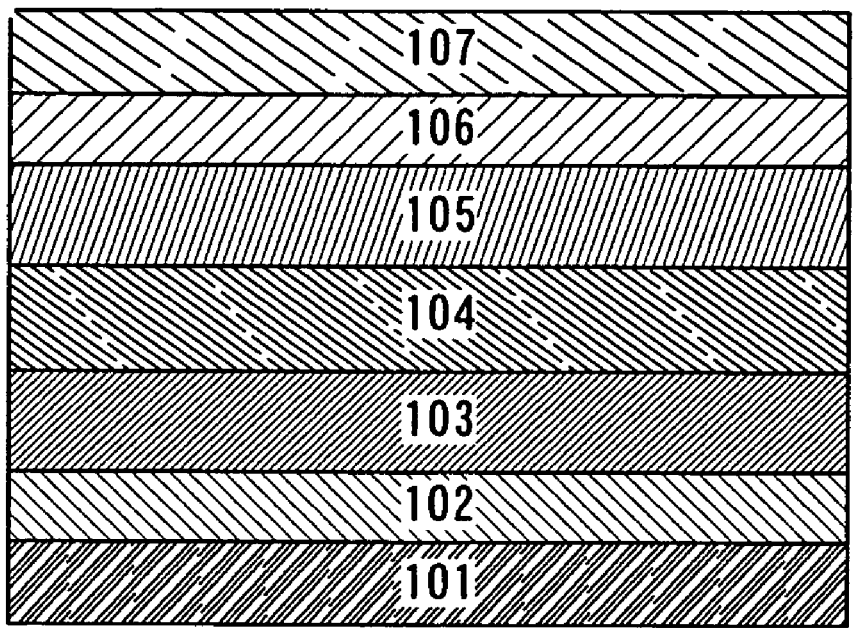
FIG. 1 is a diagram illustrating an element structure of a light-emitting element according to a certain aspect of the present invention.

An element structure of a light-emitting element of the present invention is explained with reference to FIG. 1.

The light-emitting element of the invention has a structure in which a plurality of layers is sandwiched between a pair of electrodes. The plurality of layers is formed by laminating a layer comprising a substance with high carrier transportability, a substance with high carrier injectability, or the like and a layer containing a substance selected from bismuth oxide, cobalt oxide, chromium oxide, copper oxide, nickel oxide, and titanium oxide in combination so that a light-emitting region is formed in the part separated from each electrode.

Specifically, the light-emitting element of the invention has a structure in which a first layer 102 containing a substance selected from bismuth oxide, cobalt oxide, chromium oxide, copper oxide, nickel oxide, and titanium oxide is provided to be in contact with a first electrode 101; a second layer 103 comprising a substance with high electron transportability is provided to be in contact with the first layer 102; a third layer 104 containing a light-emitting substance is provided to be in contact with the second layer 103; a fourth layer 105 comprising a substance with high hole transportability is provided to be in contact with the third layer 104; a fifth layer 106 comprising a substance with high hole injectability is provided to be in contact with the fourth layer 105; and further a second electrode 107 is provided to be in contact with the fifth layer 106. Note that the first layer 102 is formed to have the thickness in which a tunneling current flows between the first electrode 101 and the second layer 103. In addition, the first electrode 101 and the second electrode 107 function as a cathode and an anode, respectively.

As the substance with high electron transportability, a metal complex having a quinoline skeleton or a benzoquinoline skeleton such as $Alq_3$, tris(4-methyl-8-quinolinato)aluminum (hereinafter, referred to as $Almq_3$), or bis(10-hydroxybenzo[h]quinolinato)beryllium (hereinafter, referred to as $BeBq_2$); bis(2-methyl-8-quinolinato)-(4-hydroxy-biphenylyl)-aluminum (hereinafter, referred to as BAlq) which is a mixed ligand complex; or the like is given. In addition, there is also a metal complex having a oxazole-based, thiazole-based, or benzimidazole-based ligand such as bis[2-(2-hydroxyphenyl)-benzoxazolate]zinc (hereinafter, referred to as $Zn(BOX)_2$); bis[2-(2-hydroxyphenyl)-benzothiazolate]zinc (hereinafter, referred to as $Zn(BTZ)_2$); or tris-(2-(2'hydroxyphenyl)-1-phenyl-1H-benzimidazolate)aluminum (hereinafter, referred to as $Al(PBI)_3$). Furthermore, in addition to the metal complex, an oxadiazole derivative such as 2-(4-biphenyl)-5-(4-tert-butylphenyl)-1,3,4-oxadiazole (hereinafter, referred to as PBD) or 1,3-bis[5-(p-tert-butylphenyl)-1,3,4-oxadiazole-2-yl]benzene (hereinafter, referred to as OXD-7); a triazole derivative such as 3-(4-tert-butylphenyl)-4-phenyl-5-(4-biphenylyl)-1,2,4-triazole (hereinafter, referred to as TAZ) or 3-(4-tert-butylphenyl)-4-(4-ethylphenyl)-5-(4-biphenylyl)-1,2,4-triazole (hereinafter, referred to as p-EtTAZ); a phenanthroline derivative such as bathophenanthroline (hereinafter, referred to as BPhen) or bathocuproin (hereinafter, referred to as BCP); or a benzimidazole derivative such as 2,2',2''-(1,3,5-benzenetriyl)-tris(1-phenyl-1H-benzimidazole) (hereinafter, referred to as TPBI), 1,3,5-tris (4-(1-phenyl-1H-benzimidazole-2-yl)-benzolyl-benzene (hereinafter, referred to as TPBIBB), or N-phenyl-2,4,5,7-tetrakis(1-phenyl-1H-benzimidazole-2-yl)-9-phenylcarbazole (hereinafter, referred to as PBIC) is given.

As the layer containing a light-emitting substance, a mixed layer formed by arbitrarily combining, for example, a substance with high luminosity such as N,N'-dimethyl-quinacridon (abbreviated as DMQd) or 2H-chromene-2-on (abbreviated as coumarin) and a substance with high carrier transportability such as tris(8-quinolinato)aluminum (abbreviated as $Alq_3$) or 9,10-di(2-naphthyl)anthracene (abbreviated as DNA) can be used. However, since $Alq_3$ and DNA are substances with high luminosity, a layer using these substances solely can be used as a layer containing the light-emitting substance.

As the substance with high hole transportability, 4,4'-bis[N-(1-naphthyl)-N-phenyl-amino]-biphenyl (abbreviated as α-NPD) or N,N'-bis(3-methylphenyl)-N,N'-diphenyl-[1,1'-biphenyl]-4,4'-diamine (abbreviated as TPD), or an aromatic amine based (namely, those which have benzene ring-nitrogen bonds therein) compound such as 4,4',4''-tris(N,N-diphenyl-amino)-triphenylamine (abbreviated as TDATA) or 4,4',4''-tris[N-(3-methylphenyl)-N-phenyl-amino]-triphenylamine (abbreviated as MTDATA) is given.

As the substance with high hole injectability, porphyrin-based compound is effective, and phthalocyanine (hereinafter, referred to as $H_2$-Pc), copper phthalocyanine (hereinafter, referred to as Cu-Pc), or the like can be used. In addition, a material with which chemical doping is carried out on a conductive high molecular weight compound, for example, polyethylene-dioxythiophene (hereinafter, referred to as PEDOT) doped with polystyrenesulphonic acid (hereinafter, referred to as PSS) or the like can be used.

In addition, the first electrode 101 is preferable to be formed by using a material with a low work function, for example, aluminum or aluminum containing lithium, magnesium, or the like. Furthermore, the second electrode 107 is preferable to be formed by using a material with a high work function, for example, indium tin oxide (ITO), ITO containing silicon oxide, metal oxide containing 2 wt. % to 20 wt. % of zinc oxide in indium oxide, or the like.

In the light-emitting element of the invention having the above-mentioned constitution, the first electrode 101 and the first layer 102 have good adhesiveness with each other and the first layer 102 and the second layer 103 have good adhesiveness with each other.

In the light-emitting element of the invention as mentioned above, a layer containing a substance selected from bismuth oxide, cobalt oxide, chromium oxide, copper oxide, nickel oxide, and titanium oxide is provided between the electrode and the layer comprising organic compounds. Therefore, separation or the like due to the bad adhesiveness between the electrode and the organic compounds can be prevented, and as a result, stable luminescence can be obtained.

In the light-emitting element shown in the above, the first electrode 101 and the second electrode 107 may be each formed by any one of a sputtering method, a vapor deposition method, or the like. Each the first layer 102 to the fifth layer 106 may be formed by using any one of methods such as a vapor deposition method, an ink-jet method, and the like.

Note that the above is one mode of the light-emitting element of the invention, and the structure of the light-emitting element of the invention is not limited thereto.

Embodiment Mode 2

Figure 2:
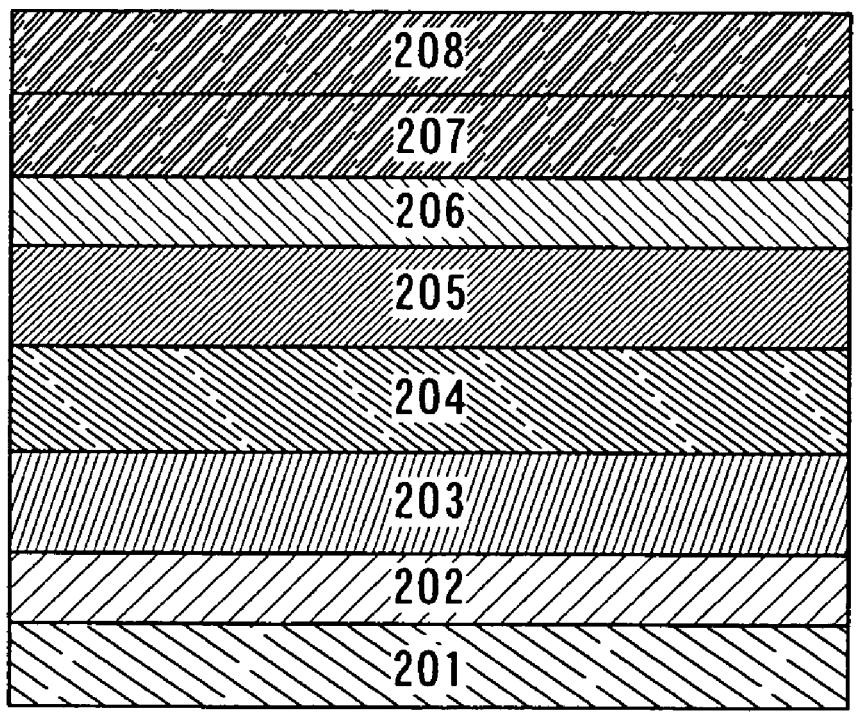
FIG. 2 is a diagram illustrating an element structure of a light-emitting element according to a certain aspect of the invention.

In this embodiment mode, a light-emitting element having a different laminated structure from that shown in Embodiment Mode 1 is explained with reference to FIG. 2.

A light-emitting element of this embodiment mode has a structure in which a first layer 202 containing a substance selected from bismuth oxide, cobalt oxide, chromium oxide, copper oxide, nickel oxide, and titanium oxide is provided to be in contact with a first electrode 201; a second layer 203 comprising a substance with high electron transportability is provided to be in contact with the first layer 202; a third layer 204 containing a light-emitting substance is provided to be in contact with the second layer 203; a fourth layer 205 comprising a substance with high hole transportability is provided to be in contact with the third layer 204; a fifth layer 206 containing a substance selected from bismuth oxide, cobalt oxide, chromium oxide, copper oxide, nickel oxide, and titanium oxide is provided to be in contact with the fourth layer 205; a sixth layer 207 comprising a substance with high hole injectability is provided to be in contact with the fifth layer 206; and further a second electrode 208 is provided to be in contact with the sixth layer 207. In addition, the first electrode 201 and the second electrode 208 function as a cathode and an anode, respectively. Note that the first layer 202 is formed to have the thickness in which a tunneling current flows. Furthermore, the same material as that shown in Embodiment Mode 1 can be used for the substance with high electron transportability, the substance with high hole transportability, the substance with high hole injectability, and a substance used for the electrodes.

Accordingly, a plurality of layers containing a substance selected from bismuth oxide, cobalt oxide, chromium oxide, copper oxide, nickel oxide, and titanium oxide may be provided. In addition, the layers may not only be provided between the electrode and the layer comprising an organic compound but also provided to be sandwiched in the layer comprising an organic compound.

Since adhesiveness with an organic compound is good in the invention, the layer containing a substance selected from bismuth oxide, cobalt oxide, chromium oxide, copper oxide, nickel oxide, and titanium oxide functions as an adhesive layer by being formed between the organic compounds with bad adhesiveness; therefore, failure such as separation or the like in a light-emitting element can be controlled. As a result, stable luminescence can be obtained.

Note that the above is one mode of the light-emitting element of the invention, and the structure of the light-emitting element of the invention is not limited thereto.

Embodiment Mode 3

There is no specific restriction on an element structure of a light-emitting element of the present invention, and it can be appropriately selected depending on the object. Basically, it is a structure in which layers containing light-emitting substances (formed by appropriately combining: a hole injection layer, a hole transport layer, a first mixed layer of a hole transport material and a light-emitting material, a light-emitting layer, a second mixed layer of a light-emitting material and an electron transport material, a hole blocking layer, an electron transport layer, an electron injection layer, and the like) are sandwiched between a pair of electrodes (an anode and a cathode). In the invention, a slash sign will be defined as hereinafter. A laminating order as described A/B/C means A is formed at first, subsequently B is formed over A, and then C is laminated over B. For example, a light-emitting element having the following structure is given: anode/hole injection layer/light-emitting layer/electron transport layer/cathode, anode/hole injection layer/hole transport layer/light-emitting layer/electron transport layer/cathode, anode/hole injection layer/hole transport layer/light-emitting layer/electron transport layer/electron injection layer/cathode, anode/hole injection layer/hole transport layer/light-emitting layer/hole blocking layer/electron transport layer/cathode, anode/hole injection layer/hole transport layer/light-emitting layer/hole blocking layer/electron transport layer/electron injection layer/cathode, anode/hole injection layer/first mixed layer/hole transport layer/light-emitting layer/hole blocking layer/electron transport layer/electron injection layer/cathode, anode/hole injection layer/hole transport layer/light-emitting layer/second mixed layer/electron transport layer/electron injection layer/cathode, anode/hole injection layer/first mixed layer/hole transport layer/light-emitting layer/second mixed layer/electron transport layer/electron injection layer/cathode, anode/hole injection layer/first mixed layer/hole transport layer/second mixed layer/light-emitting layer/third mixed layer/electron transport layer/fourth mixed layer/hole blocking layer/fifth mixed layer/electron injection layer/cathode, or the like. At this time, an organic compound and any one of compounds selected from bismuth oxide, cobalt oxide, copper oxide, magnesium oxide, nickel oxide, zinc oxide, and titanium oxide can be used for the hole transport layer, the hole injection layer, the electron transport layer, the electron injection layer, and the above-mentioned mixed layer. In the light-emitting element of the invention, it may be laminated from either an anode or a cathode.

Figure 6A:
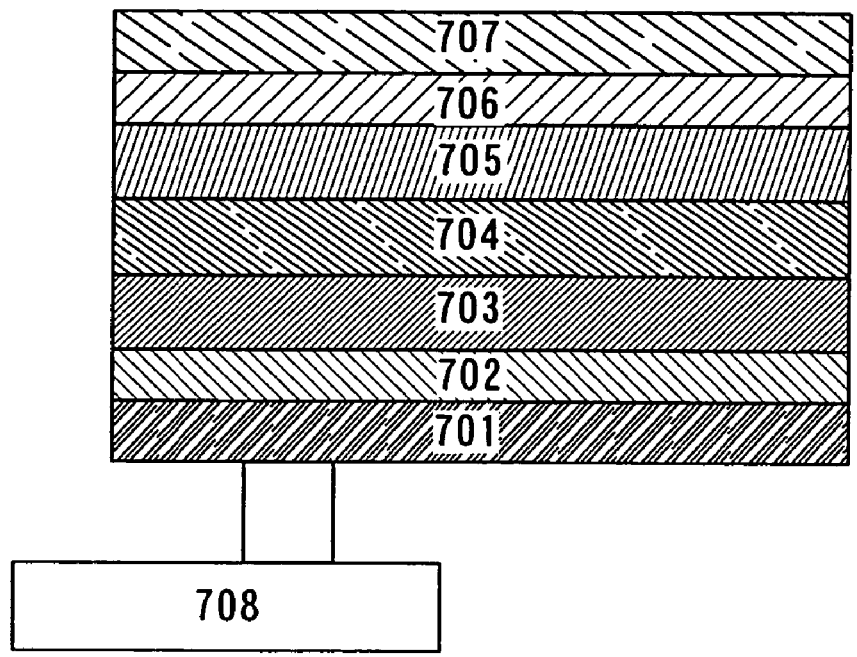
FIGS. 6A and 6B are diagrams illustrating an element structure of a light-emitting element according to a certain aspect of the invention.
Figure 6B:
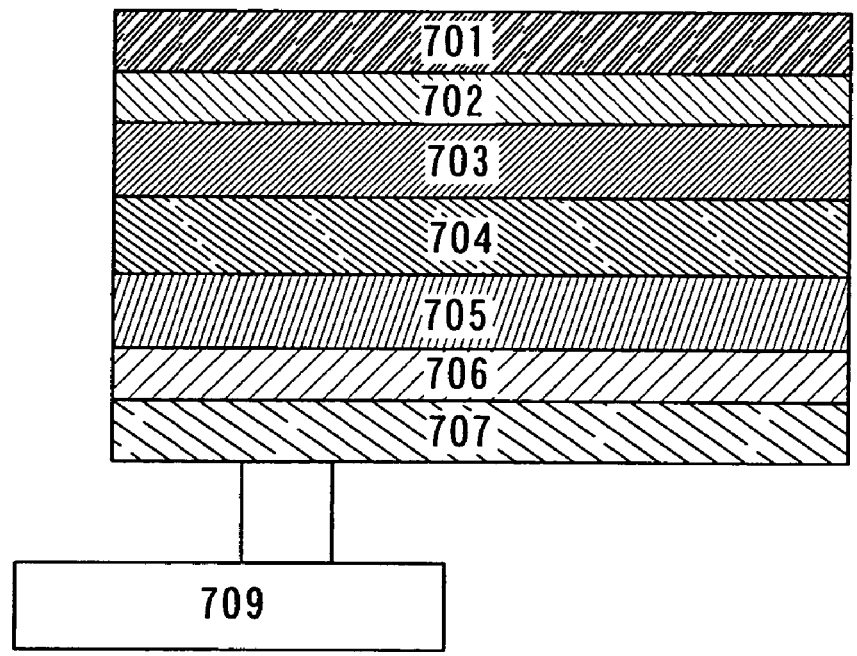

For example, FIG. 6A is a diagram in which lamination is stacked from an anode of a light-emitting element, and FIG. 6B is a diagram in which lamination is stacked from a cathode of a light-emitting element. In FIG. 6A, hole injection layer 702/hole transport layer 703/light-emitting layer 704/electron transport layer 705/electron injection layer 706/cathode 707 are sequentially laminated from an anode 701. Here, a p-channel type TFT 708 is attached to the anode. In addition, in FIG. 6B, electron injection layer 706/electron transport layer 705/light-emitting layer 704/hole transport layer 703/hole injection layer 702/anode 701 are sequentially laminated from a cathode 707. Here, an n-channel type TFT 709 is attached to the cathode. In addition, in this embodiment mode, an example using a hole injection layer, a hole transport layer, a light-emitting layer, an electron transport layer, and an electron injection layer is shown as a layer containing a light-emitting substance sandwiched between an anode and a cathode. However, it is not necessarily needed, and an auxiliary layer such as a hole blocking layer, a mixed layer, or the like can be also formed.

In addition, the light-emitting element of the invention is preferable to be supported by a substrate. There is no specific restriction on the substrate, and a substrate used for a conventional light-emitting element, for example, a substrate made from glass, quartz, metal, a bulk semiconductor, transparent plastic, a flexible substrate, or the like can be used.

It is preferable to use metal, alloy, an electrical conductive compound, and a mixture thereof with a high work function (work function: 4.0 eV or more) for an anode material of the light-emitting element of the invention. As a specific example of the anode material, in addition to ITO (indium tin oxide), ITO containing silicon oxide, and metal oxide mixed with 2 wt. % to 20 wt. % of indium oxide in indium oxide, gold (Au), platinum (Pt), nickel (Ni), tungsten (W), chromium (Cr), a molybdenum (Mo), iron (Fe), cobalt (Co), copper (Cu), palladium (Pd), nitride (TiN) of a metal material, or the like can be used.

On the other hand, it is preferable to use metal, alloy, an electrical conductive compound, and a mixture thereof with a low work function (work function: 3.8 eV or less) for a cathode material. As a specific example of the cathode material, an alkali metal (for example, Li, Na, K, Cs, or the like), an alkaline earth metal (for example, Mg, Ca, or the like), gold, silver, lead, aluminum, or a mixed metal thereof, for example, an aluminum-lithium alloy, a magnesium-silver alloy, a mixed metal thereof, or the like can be used.

Note that each cathode and anode is formed by forming a thin film by a vapor deposition method, a sputtering method, or the like with the above-mentioned anode material and cathode material. The film thickness is preferable to be from 10 nm to 500 nm.

Lastly, a protective layer (barrier layer) made from an inorganic material such as SiN or an organic material such as Teflon or styrene polymer is formed. The barrier layer may be either transparent or not transparent, and the inorganic material or organic material is formed by a vapor deposition method, a sputtering method, or the like.

Furthermore, a drying agent of SrOx, SiOx, or the like is formed by an electron beam irradiation method, a vapor deposition method, a sputtering method, a sol-gel method, or the like to prevent the organic layers or the electrodes of the light-emitting element from being oxidized and humidified.

In addition, in the light-emitting element of the invention, light generated by recombining a carrier in the layer containing a light-emitting substance has a structure in which it is emitted outside from either the anode or the cathode or the both thereof. In other words, the anode is formed from a light-transmitting material in the case of emitting light from the anode and the cathode is formed from a light-transmitting material in the case of emitting light from the cathode.

In addition, a known material can be used for the layer containing a light-emitting substance, and either a low molecular weight material or a high molecular weight material can be used. Not only a material made only from an organic compound material but also a material that partially containing an inorganic compound is included in a structure of a material from which the layer containing a light-emitting substance is formed.

Note that the layer containing a light-emitting substance is formed by laminating a combination of: a hole injection layer comprising a hole injection material; a first mixed layer containing both the hole injection material and a hole transport material; a hole transport layer comprising the hole transport material; a second mixed layer containing both the hole transport material and a light-emitting material; a light-emitting layer comprising the light-emitting material; a third mixed layer containing both the light-emitting material and an electron transport material; an electron transport layer comprising the electron transport material; a fourth mixed layer containing both the electron transport material and an electron injection material; a hole blocking layer comprising a hole blocking material; a fifth mixed layer containing both the hole blocking material and an electron injection material; an electron injection layer comprising the electron injection material; and the like. In the invention, an organic compound and any one of compounds selected from bismuth oxide, cobalt oxide, copper oxide, magnesium oxide, nickel oxide, zinc oxide, and titanium oxide may be used for a layer different from the light-emitting layer. Specifically, it is preferable to use for the electron transport layer or the hole transport layer. In addition, in respect of adhesiveness with the electrodes, it is preferable to use for the electron injection layer or the hole injection layer.

When an organic compound and any one of compounds selected from bismuth oxide, cobalt oxide, copper oxide, magnesium oxide, nickel oxide, zinc oxide, and titanium oxide are made to serve as an electron transport layer as an electron transport material in the invention, a light-emitting element can be also formed by laminating a combination besides the electron transport layer in the layer containing a light-emitting material formed between the pair of electrodes. Note that the layer containing a light-emitting substance in this case can have a structure in which a hole injection layer, a hole transport layer, a light-emitting layer, the mixed layer, an electron injection layer, and a hole blocking layer are combined besides the electron transport layer, if necessary. Hereinafter, specific materials used in this case are shown.

As the hole injection material, a porphyrin-based compound is effective as long as it is an organic compound, and phthalocyanine (hereinafter, referred to as $H_2$-Pc), copper phthalocyanine (hereinafter, referred to as Cu-Pc), or the like can be used. In addition, there is also a material in which chemical doping is carried out on a conductive high molecular weight compound, and polyethylene dioxythiophene (hereinafter, referred to as PEDOT) doped with polystyrene-sulphonic acid (hereinafter, referred to as PSS) or the like can be also used. Furthermore, a conductive inorganic compound such as molybdenum oxide (hereinafter, referred to as MoOx) or a composite material of the conductive inorganic material and a hole transport material shown below can be used.

In addition, an aromatic amine-based compound (that is; a compound having benzene ring-nitrogen bond) is preferable for the hole transport material. As materials that are widely used, for example, in addition to N,N'-bis(3-methylphenyl)-N,N'-diphenyl-[1,1'-biphenyl]-4,4'-diamine (hereinafter, referred to as TPD), a derivative thereof such as 4,4'-bis[N-(1-naphthyl)-N-phenyl-amino]-biphenyl (hereinafter, referred to as α-NPD) and a star burst aromatic amine compound such as 4,4',4"-tris(N-carbazolyl)-triphenylamine (hereinafter, referred to as TCTA); 4,4',4"-tris(N,N-diphenyl-amino)-triphenylamine (hereinafter, referred to as TDATA); and 4,4',4"-tris[N-(3-methylphenyl)-N-phenyl-amino]-triphenylamine (hereinafter, referred to as MTDATA) are included. In addition, a composite material of a conductive inorganic compound such as MoOx and the organic compound can be also used.

A metal complex such as tris(8-quinolinato)aluminum (hereinafter, referred to as $Alq_3$) is given as the light-emitting material. In addition, quinacridon, coumarin, rubrene, styryl-based pigment in unit as well as tetraphenylbutadiene, anthracene, perylene, coronene, 12-phthaloperinone derivatives can be also used. The light-emitting layer may also serve as an electron injection transport layer, and in such a case, it is preferable to use $Alq_3$ or the like.

In addition, the above-mentioned BAlq, OXD-7, TAZ, p-EtTAZ, BPhen, BCP, or the like can be used for the hole blocking material.

As for the electron transport material, a metal complex having a quinoline skeleton or a benzoquinoline skeleton such as $Alq_3$, tris(4-methyl-8-quinolinato)aluminum (hereinafter, referred to as $Almq_3$), or bis(10-hydroxybenzo[h]quinolinato)beryllium (hereinafter, referred to as $BeBq_2$); bis(2-methyl-8-quinolinato)-(4-hydroxy-biphenylyl)-aluminum (hereinafter, referred to as BAlq) which is a mixed ligand complex; or the like is preferable. In addition, there is also a metal complex having a oxazole-based, thiazole-based, or benzimidazole-based ligand such as bis[2-(2-hydroxyphenyl)-benzoxazolate]zinc (hereinafter, referred to as Zn$(BOX)_2$); bis[2-(2-hydroxyphenyl)-benzothiazolate]zinc (hereinafter, referred to as Zn(BTZ) $_2$); or tris-(2-(2'hydroxyphenyl)-1-phenyl-1H-benzimidazolate)aluminum (hereinafter, referred to as $Al(PBI)_3$).

Furthermore, in addition to the metal complex, an oxadiazole derivative such as: 2-(4-biphenylil)-5-(4-tert-butylphenyl)-1,3,4-oxadiazole (hereinafter, referred to as PBD) or 1,3-bis[5-(p-tert-butylphenyl)-1,3,4-oxadiazole-2-yl]benzene (hereinafter, referred to as OXD-7); a triazole derivative such as: 3-(4-tert-butylphenyl)-4-phenyl-5-(4-biphenylil)-1,2,4-triazole (hereinafter, referred to as TAZ) or 3-(4-tert-butylphenyl)-4-(4-ethylphenyl)-5-(4-biphenylil)-1,2,4-triazole (hereinafter, referred to as p-EtTAZ); a phenanthroline derivative such as: bathophenanthroline (hereinafter, referred to as BPhen) or bathocuproin (hereinafter, referred to as BCP); or a benzimidazole derivative such as: 2,2',2"-(1,3,5-benzenetriyl)-tris(1-phenyl-1H-benzimidazole) (hereinafter, referred to as TPBI), 1,3,5-tris(4-(1-phenyl-1H-benzimidazole-2-yl)-benzolyl-benzene (hereinafter, referred to as TPBIBB), or N-phenyl-2,4,5,7-tetrakis(1-phenyl-1H-benzimidazole-2-yl)-9-phenylcarbazole (hereinafter, referred to as PBIC) can be used.

In addition, metal oxide or metal halide may be used as an electron injection layer between the cathode and the layer containing a light-emitting substance. As a specific example of the electron injection layer, $Li_2O$, MgO, or $Al_2O_3$ can be used for the metal oxide and LiF, $MgF_2$, $SrF_2$, or the like can be used for the metal halide.

As mentioned above, an organic compound and any one of compounds selected from bismuth oxide, cobalt oxide, copper oxide, magnesium oxide, nickel oxide, zinc oxide, and titanium oxide are used for a layer different from the light-emitting layer. Accordingly, bondability in the laminated interface inside the element can be enhanced. Consequently, it is possible to manufacture a light-emitting element in which light is emitted efficiently and stable luminescence can be obtained for a long stretch of time.

Embodiment Mode 4

Figure 3:
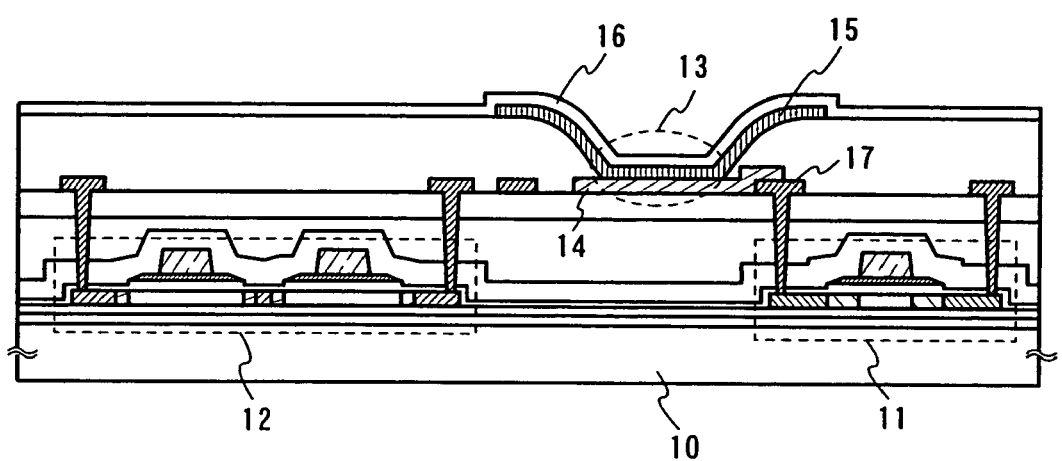
FIG. 3 is a view illustrating an active matrix type light-emitting device applying a light-emitting element according to a certain aspect of the invention.

A passive type light-emitting device can be manufactured by manufacturing a plurality of light-emitting elements shown in Embodiment Mode 1, Embodiment Mode 2, or Embodiment Mode 3 over a substrate made from glass, quartz, metal, a bulk semiconductor, transparent plastic, a flexible substrate, or the like. In addition, a light-emitting element to be in contact with, for example, a thin film transistor (TFT) array as shown in FIG. 3 may be manufactured besides the substrate made from glass, quartz, transparent plastic, a flexible substrate, or the like. In FIG. 3, reference numeral 10 denotes a substrate; 11 and 12, TFTs; and 13, a light-emitting element having a first electrode 14; a layer at least containing a layer including a substance selected from bismuth oxide, cobalt oxide, chromium oxide, copper oxide, nickel oxide, and titanium oxide or a layer 15 at least having a layer of a mixed region of a substance selected from bismuth oxide, cobalt oxide, copper oxide, magnesium oxide, nickel oxide, zinc oxide, and titanium oxide and an organic compound different from a luminous body in a layer different from a light-emitting layer; and a second electrode 16, wherein it is electrically connected to the TFT 11 through a wiring 17. Accordingly, an active matrix type light-emitting device, which controls driving of a light-emitting element by a TFT, can be manufactured. Note that a structure of the TFT is not specifically limited. For example, it may be either a stagger type or a reverse stagger type. Crystallinity of a semi-conductor layer composing the TFT is not specifically limited either, and either a crystalline semiconductor layer or an amorphous semiconductor layer may be accepted.

Embodiment 1

Figure 7:
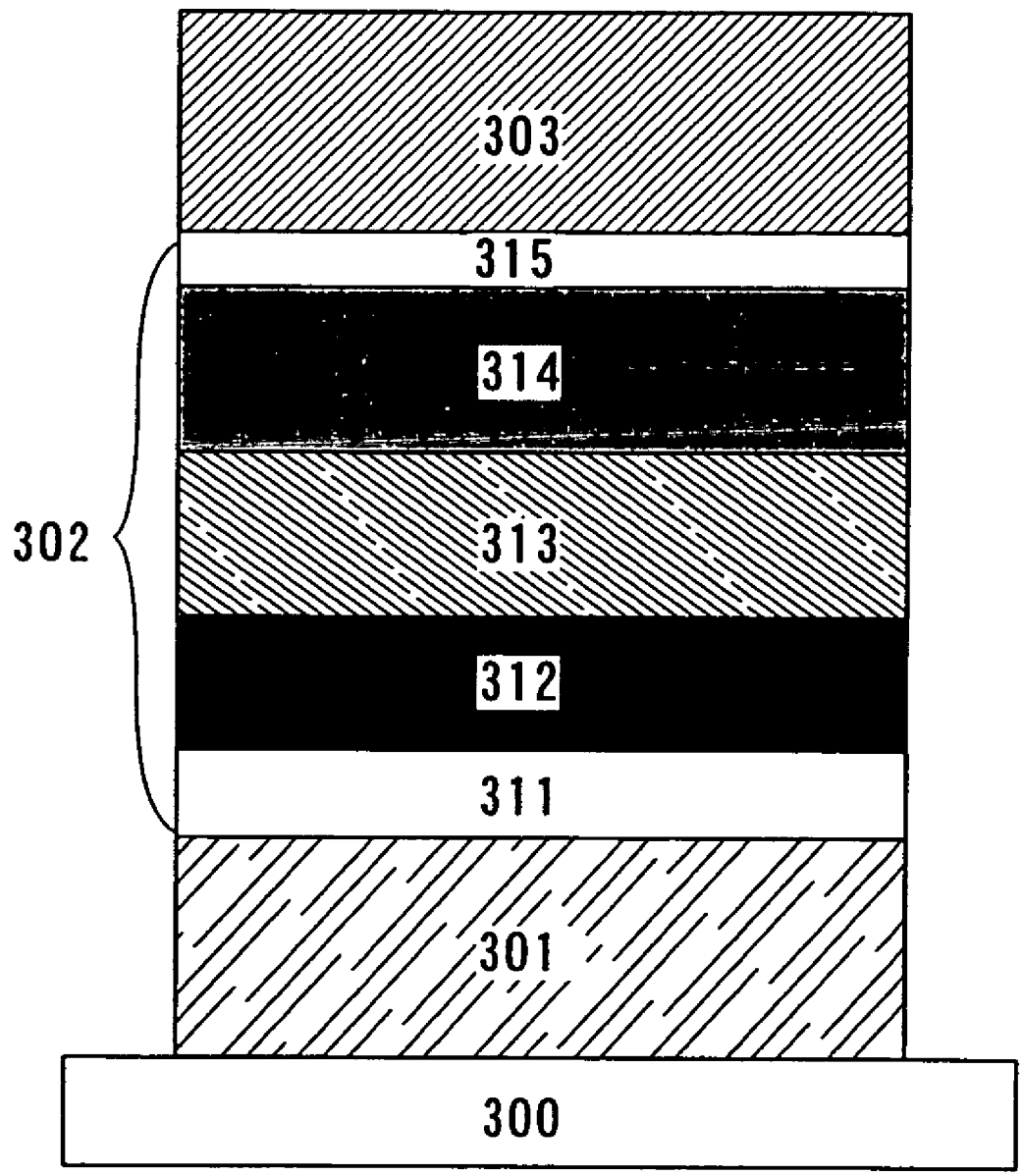
FIG. 7 is a diagram illustrating an element structure of a light-emitting element according to a certain aspect of the invention.

A light-emitting element of the present invention is specifically explained with reference to FIG. 7 in this Embodiment 1.

First, a first electrode 301 of a light-emitting element is formed on a substrate 300. Note that the first electrode 301 functions as an anode in this embodiment. ITO which is a transparent conductive film is used as the material, and it is formed to have a 110 nm film thickness by a sputtering method.

Next, a layer containing a light-emitting substance 302 is formed over the first electrode (anode) 301. Note that the layer containing a light-emitting substance 302 in this embodiment has a laminated structure of a hole injection layer 311, a hole transport layer 312, a light-emitting layer 313, an electron transport layer 314, and an electron injection layer 315.

The substrate over which the first electrode 101 is formed is fixed in a substrate holder of a commercially available vacuum evaporator with the surface over which the first electrode 301 is formed below, copper phthalocyanine (hereinafter, referred to as Cu-Pc) is put in an evaporation source provided inside the vacuum evaporator, and the hole injection layer 311 is formed to have a 20 nm film thickness by a vapor deposition method using a resistive heating method. Note that a known hole injection material can be used as a material from which the hole injection layer 311 is formed.

Next, the hole transport layer 312 is formed by a material superior in terms of hole transportability. A known hole transport material can be used as a material from which the hole transport layer 312 is formed. In this embodiment, it is formed to have a 40 nm film thickness from α-NPD and MoOx with a weight ratio to be 1:1 by the same method.

Next, the light-emitting layer 313 is formed. Note that a hole and an electron recombine and luminescence is generated in the light-emitting layer 313. In this embodiment, $Alq_3$ is used for the material from which the light-emitting layer 313 is formed and it is formed by a vapor deposition method to have a 30 nm film thickness.

Next, the electron transport layer 314 is formed. A known electron transport material can be used as the material from which the electron transport layer 314 is formed. In this embodiment, $Alq_3$ and TiOx are used, and it is formed to have a 20 nm film thickness with 50 wt. % of TiOx by a sputtering method or a vapor deposition method.

Next, the electron injection layer 315 is formed. A known electron injection material can be used as the material from which the electron injection layer 315 is formed. In this embodiment, calcium fluoride (hereinafter, referred to as CaF2) is used, and it is formed by a vapor deposition method to have a 2 nm film thickness.

Accordingly, the layer containing a light-emitting substance 302 formed by laminating the hole injection layer 311, the hole transport layer 312, the light-emitting layer 313, the electron transport layer 314, and the electron injection layer 315 is formed. Thereafter, a second electrode 303 functioning as a cathode is formed by a sputtering method or a vapor deposition method. Note that, in this embodiment, the second electrode 303 is formed by forming aluminum (150 nm) over the layer containing a light-emitting substance 302 by a vapor deposition method.

As mentioned above, the light-emitting element of the invention is formed.

Embodiment 2

Figure 8A:
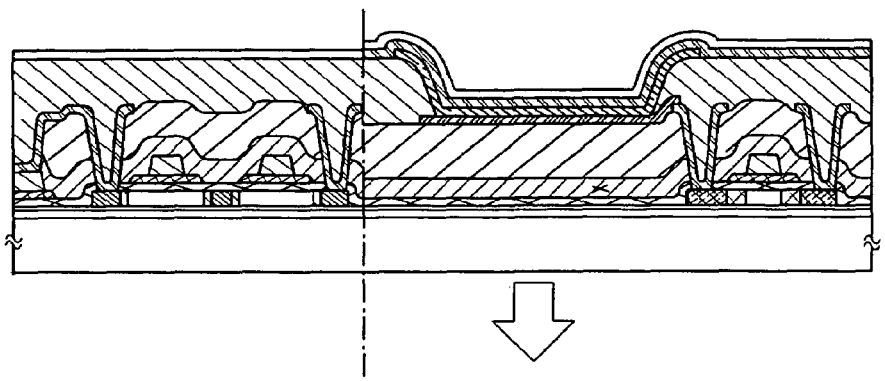
FIGS. 8A to 8C are diagrams illustrating an element structure of a light-emitting element according to a certain aspect of the invention.
Figure 8A:
Figure 8B:
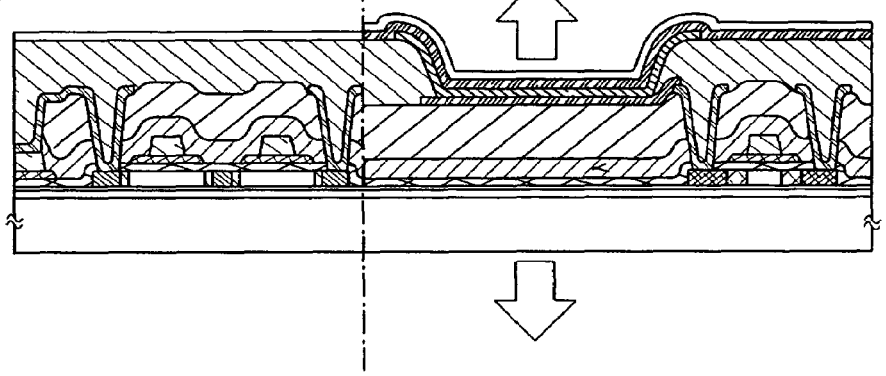
Figure 8B:
Figure 8B:
Figure 8C:
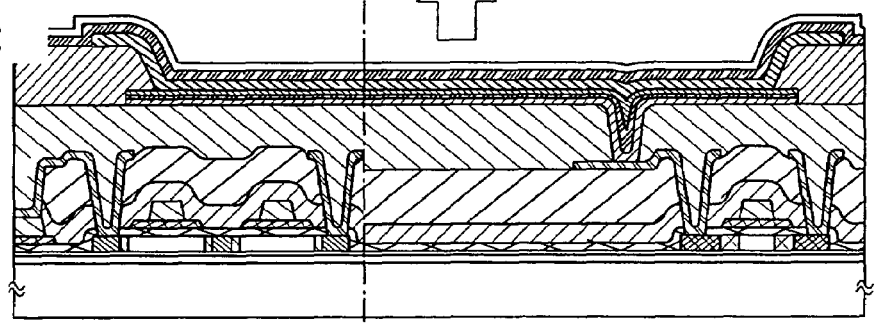

A light-emitting element of the present invention used for a light-emitting device is explained in this embodiment with reference to FIGS. 6A and 6B and FIGS. 8A to 8C. Note that FIG. 8A is a cross-sectional view in which light generated by recombining a carrier in a layer containing a light-emitting substance is emitted outside from below of a light-emitting device having a light-emitting element. FIG. 8B is a cross-sectional view in which light generated by recombining a carrier in a layer containing a light-emitting substance is emitted outside from both top and bottom of a light-emitting device having a light-emitting element. In addition, FIG. 8C is a cross-sectional view in which light is emitted outside from above a light-emitting device having a light-emitting element. In FIG. 8A, an anode of a light-emitting element having the same structure as in FIG. 6A is formed from a light-transmitting material and light is emitted from the anode side. In the case of a light-emitting element having the same structure as in FIG. 6B, a cathode is formed from a light-transmitting material and light is emitted from the cathode side. In addition, in FIG. 8B, in the case of a light-emitting element having the same structure as in FIGS. 6A and 6B, both an anode and a cathode are formed from a light-transmitting material and light is emitted from both the anode and cathode side. In FIG. 8C, a cathode of a light-emitting element having the same structure as in FIG. 6A is formed from a light-transmitting material and light is emitted from the cathode side. In the case of a light-emitting element having the same structure as in FIG. 6B, an anode is formed from a light-transmitting material and light is emitted from the anode side.

Embodiment 3

Figure 4A:
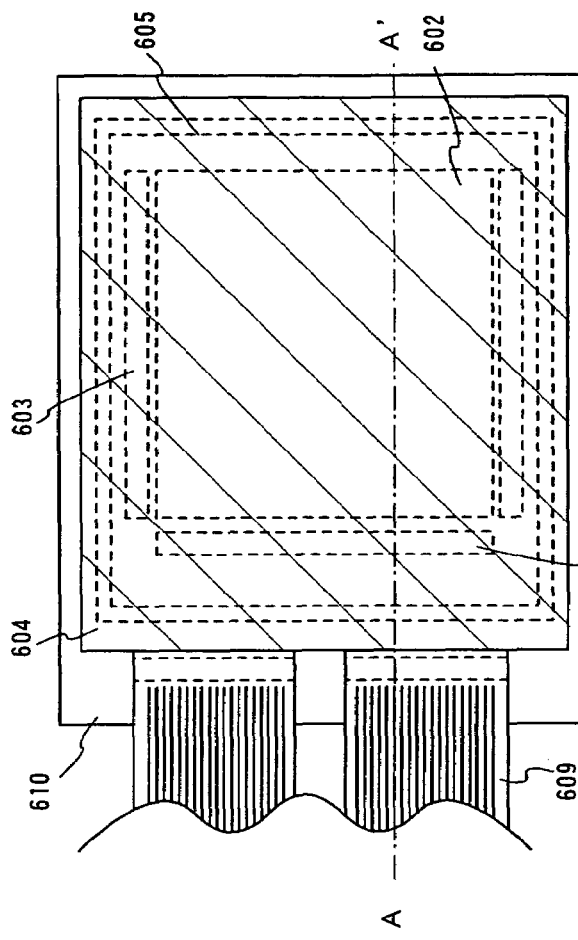
FIGS. 4A and 4B are views illustrating a light-emitting device applying the invention.
Figure 4B:
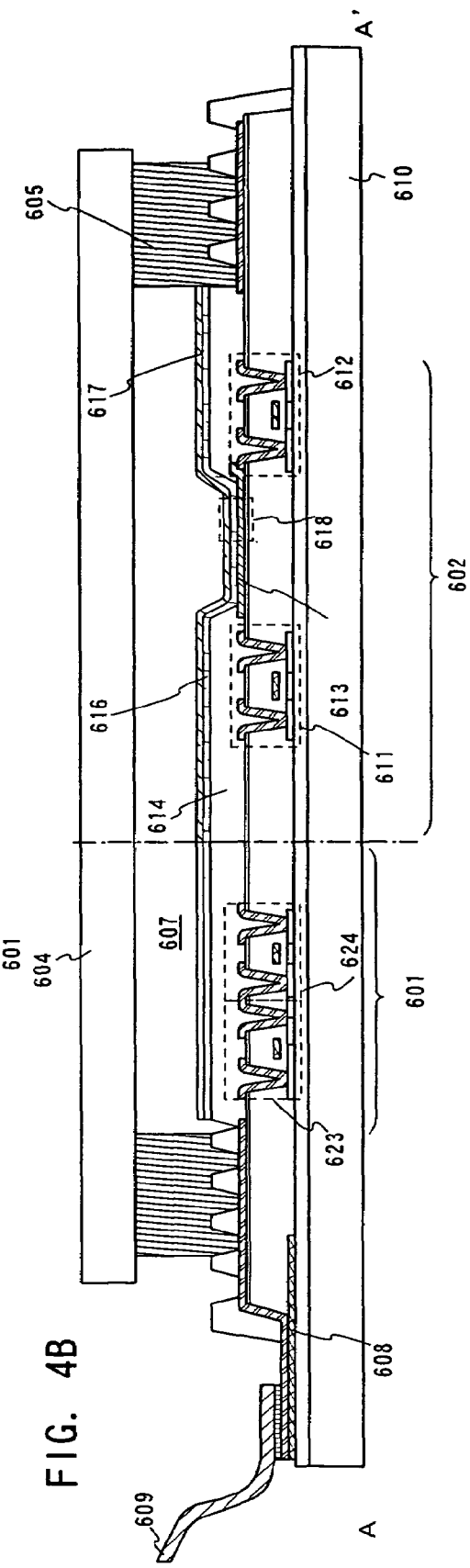

A light-emitting device having a light-emitting element of the present invention in a pixel portion is explained in this embodiment with reference to FIGS. 4A and 4B. Note that FIG. 4A is a top view illustrating a light-emitting device and FIG. 4B is a cross-sectional view provided by cutting along a line A-A'. Reference numeral 601 shown in a dotted line denotes a driver circuit portion (a source side driver circuit); 602, a pixel portion; and 603, a driver circuit portion (a gate side driver circuit). In addition, reference numeral 604 denotes a sealing substrate and 605, a sealant, and an inner side 607 surrounded with the sealant 605 serves as space.

Note that reference numeral 608 denotes a wiring for transmitting a signal inputted into the source side driver circuit 601 and the gate side driver circuit 603, and receives a video signal, a clock signal, a start signal, a reset signal, or the like from an FPC (flexible printed circuit) 609 which serves as an external input terminal. Note that only the FPC is shown here; however, a printed wiring board (PWB) may be attached to this FPC. The light-emitting device in this specification includes not only the light-emitting device itself but also a state in which an FPC or a PWB is attached thereto.

Next, a cross-sectional structure is explained with reference to FIG. 4B. A driver circuit portion and a pixel portion are formed over a substrate 610; however, the source side driver circuit 601, which is a driver circuit portion, and the pixel portion 602 are shown here.

Note that a CMOS circuit combining an n-channel type TFT 623 and a p-channel type TFT 624 is formed in the source side driver circuit 601. In addition, a TFT which forms a driver circuit may be formed from a known CMOS circuit, PMOS circuit, or NMOS circuit. An integral type with a driver in which a driver circuit is formed over a substrate is shown in this embodiment; however, it is not necessarily needed, and it can be formed not over a substrate but also exteriorly.

In addition, the pixel portion 602 is formed of a plurality of pixels including a switching TFT 611, a TFT for current control 612, and a first electrode 613 electrically connected to a drain thereof. Note that an insulator 614 is formed by covering an edge of the first electrode 613. Here, it is formed by using a positive type photosensitive acrylic resin film.

In addition, a curved surface having curvature is to be formed at the upper end or bottom end of the insulator 614 in order to obtain good deposition properties. For example, in the case of using a positive type photosensitive acrylic as a material of the insulator 614, it is preferable to give a curved surface having a curvature radius (from 0.2 μm to 3 μm) only for the upper end of the insulator 614. In addition, either a negative type insoluble in etchant by photosensitive light or a positive type soluble in etchant by light can be used as the insulator 614. Not only an organic compound but also an inorganic compound, for example, silicon oxide, silicon oxynitride, siloxane-based, or the like can be used as well.

A layer containing a light-emitting substance 616 and a second electrode 617 are each formed over the first electrode 613. Here, it is desirable to use a material with a high work function as a material used for the first electrode 613 functioning as an anode. For example, lamination of a film containing titanium nitride and aluminum as the main component, three-layered structure of a titanium nitride film, a film containing aluminum as the main component, and a titanium nitride film, or the like can be used in addition to a single-layered film such as an ITO (indium tin oxide) film, an ITSO (indium tin silicon oxide) film, an indium zinc oxide (IZO) film, a titanium nitride film, a chromium film, a tungsten film, a Zn film, or a Pt film. By applying the laminated structure, resistance thereof as a wiring can be made lower, a satisfactory ohmic contact can be obtained, and further, it can be operated as an anode.

In addition, the layer containing a light-emitting substance 616 is formed by a vapor deposition method using a vapor-deposition mask or an ink-jet method.

The layer containing a light-emitting substance 616 contains bismuth oxide, cobalt oxide, chromium oxide, copper oxide, nickel oxide, or titanium oxide; or an organic compound and any one of compounds selected from bismuth oxide, cobalt oxide, copper oxide, magnesium oxide, nickel oxide, zinc oxide, and titanium oxide. In forming a layer containing these bismuth oxide, cobalt oxide, chromium oxide, copper oxide, nickel oxide, magnesium oxide, zinc oxide, or titanium oxide, bismuth oxide, cobalt oxide, chromium oxide, copper oxide, nickel oxide, magnesium oxide, zinc oxide, or titanium oxide may be formed from ultrafine powder by using the above-mentioned method, which is much more effective in improving bondability between films during lamination. In addition, a low molecular weight material, a middle molecular weight material (including oligomer, dendrimer), or a high molecular weight material may be used for a material used by being combined with bismuth oxide, cobalt oxide, chromium oxide, copper oxide, nickel oxide, or titanium oxide or for a material used by being combined with an organic compound and any one of compounds selected from bismuth oxide, cobalt oxide, copper oxide, magnesium oxide, nickel oxide, zinc oxide, and titanium oxide. In addition, an organic compound is generally used in a single layer, a laminated layer, or a mixed layer for a material used for the layer containing a light-emitting substance; however, the invention also includes a structure in which an inorganic compound is partially contained in a film made from an organic compound.

Moreover, a material with a low work function (Al, Ag, Li, Ca, or an alloy thereof, MgAg, MgIn, AlLi, $CaF_2$, or CaN) may be used as a material used for the second electrode (cathode) 617 formed over the layer containing a light-emitting substance 616. Note that lamination of a thin metal film with a thin film thickness and a transparent conductive film (ITO (indium tin oxide), ITSO (indium tin silicon oxide), indium zinc oxide($In_2O_3$—ZnO), zinc oxide (ZnO), or the like) may be used as the second electrode (cathode) 617 in the case of transmitting light generated in the layer containing a light-emitting substance 616 through the second electrode 617.

Furthermore, the space 607 surrounded with the element substrate 610, the sealing substrate 604, and the sealant 605 has a structure provided with a light-emitting element 618 by attaching the sealing substrate 604 to the element substrate 610 with the sealant 605. The space 607 includes a structure filled with the sealant 605 as well as the case where an inert gas (nitrogen, argon, or the like) is filled.

Note that it is preferable to use an epoxy-based resin for the sealant 605. In addition, it is desirable that the material does not transmit moisture or oxygen as much as possible. A plastic substrate made from FRP (Fiberglass-Reinforced Plastics), PVF (polyvinyl fluoride), myler, polyester, acrylic, or the like can be used in addition to a glass substrate or a quartz substrate as a material used for the sealing substrate 604.

As mentioned above, the light-emitting device having the light-emitting element of the invention can be obtained.

Embodiment 4

Various electric appliances completed by using a light-emitting device having a light-emitting element of the present invention are explained in this embodiment.

An electric appliance manufactured by using the light-emitting device applying the invention includes a television; a video camera; a digital camera; a goggle type display (a head mounted display); a navigation system; an audio reproducing device (a car audio, an audio component, or the like); a laptop personal computer; a game machine; a personal digital assistant (a mobile computer, a cellular phone, a portable game machine, an electronic book, or the like); an image reproduction device provided with a recording medium (specifically a device that is capable of playing a recording medium such as a Digital Versatile Disc (DVD) and that has a display device which can display the image); or the like. A specific example of such an electric appliance is shown in FIG. 5.

Figure 5:
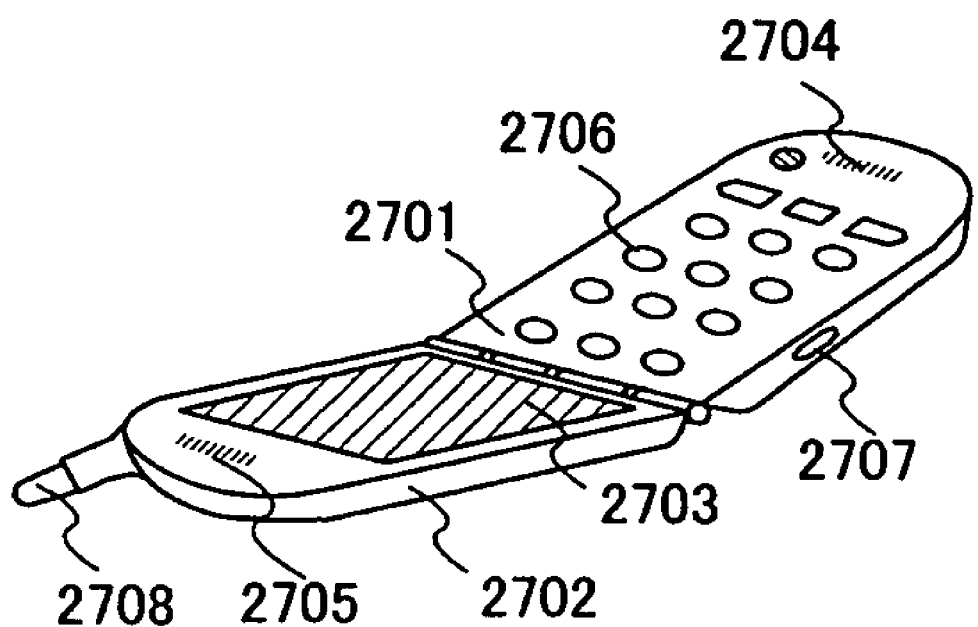
FIG. 5 is a view illustrating an electric appliance applying the invention.

Here, FIG. 5 is a cellular phone, which includes a main body 2701, a casing 2702, a display portion 2703, an audio input portion 2704, an audio output portion 2705, operation keys 2706, an external connection port 2707, an antenna 2708, and the like. It is manufactured by applying the light-emitting device having the light-emitting element of the invention to the display portion 2703.

As mentioned above, the application range of the light-emitting element having the light-emitting element of the invention is extremely wide. The light-emitting element used for the light-emitting device is formed by using the light-emitting element of the invention; therefore, it has a feature of a low drive voltage and extended life. Thus, low power consumption and extended life can be achieved by applying this light-emitting device to electric appliances in various fields.

This application is based on Japanese Patent Application serial no. 2003-403684 and 2003-403685 filed in Japanese Patent Office on Dec. 2, 2003, the contents of which are hereby incorporated by reference.

What is claimed is:

1. A light-emitting element comprising:
   a cathode and an anode; and
   a plurality of layers sandwiched between the cathode and anode,
   wherein the plurality of layers include:
      a first layer comprising a composite material of an organic compound and a conductive inorganic compound;
      a second layer having an organic compound; and
      a layer consisting of a substance selected from bismuth oxide, cobalt oxide, chromium oxide, copper oxide, and nickel oxide,
   wherein the layer is in contact with the cathode.

2. A light-emitting element according to claim 1, wherein the layer is arranged to have a thickness enough for a tunneling current to flow.

3. A light-emitting device having the light-emitting element according to claim 2.

4. A light emitting device according to claim 3,
   wherein the light emitting device is incorporated into an electronic device.

5. A light-emitting device having the light-emitting element according to claim 1.

6. A light emitting device according to claim 5,
   wherein the light emitting device is incorporated into an electronic device.

7. A light emitting device according to claim 1,
   wherein the conductive inorganic compound is molybdenum oxide.

8. A light emitting device according to claim 1,
   wherein the conductive inorganic compound is molybdenum oxide, and wherein the organic compound in the first layer is an aromatic amine.

9. A light-emitting element comprising:
   a pair of electrodes; and
   a plurality of layers sandwiched between the pair of electrodes,
   wherein the plurality of layers include:
      a first layer having an organic compound;
      a second layer having an organic compound; and
      a layer consisting of a substance selected from bismuth oxide, cobalt oxide, chromium oxide, copper oxide, and nickel oxide,
   wherein the layer is in contact with one of the pair of electrodes which functions as a cathode.

10. A light-emitting device having the light-emitting element according to claim 9.

11. A light emitting device according to claim 10,
    wherein the light emitting device is incorporated into an electronic device.

* * * * *

UNITED STATES PATENT AND TRADEMARK OFFICE
CERTIFICATE OF CORRECTION

PATENT NO.      : 7,605,534 B2  Page 1 of 1
APPLICATION NO. : 10/994371
DATED           : October 20, 2009
INVENTOR(S)     : Yamazaki et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 523 days.

Signed and Sealed this

Fifth Day of October, 2010

David J. Kappos
*Director of the United States Patent and Trademark Office*